United States Patent
Sun et al.

(10) Patent No.: US 10,965,438 B1
(45) Date of Patent: Mar. 30, 2021

(54) SIGNAL RECEIVING CIRCUIT, MEMORY STORAGE DEVICE AND SIGNAL RECEIVING METHOD

(71) Applicant: PHISON ELECTRONICS CORP., Miaoli (TW)

(72) Inventors: Shih-Yang Sun, Taoyuan (TW); Sheng-Wen Chen, Taichung (TW); Yen-Po Lin, Kaohsiung (TW); Bo-Jing Lin, Hsinchu (TW); Po-Min Cheng, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/779,666

(22) Filed: Feb. 3, 2020

(30) Foreign Application Priority Data

Dec. 20, 2019 (TW) .................................. 108146821

(51) Int. Cl.
    *H04L 7/00* (2006.01)
    *H04L 25/03* (2006.01)
    *H03L 7/085* (2006.01)
    *H03L 7/099* (2006.01)

(52) U.S. Cl.
    CPC ............ *H04L 7/0058* (2013.01); *H03L 7/085* (2013.01); *H03L 7/0991* (2013.01); *H04L 7/0025* (2013.01); *H04L 25/03057* (2013.01)

(58) Field of Classification Search
    CPC .............. H04L 7/0025; H04L 7/0058; H04L 25/03019; H04L 25/03057
    See application file for complete search history.

(56) References Cited

U.S. PATENT DOCUMENTS

| 8,208,591 | B2* | 6/2012 | Flynn ............... H04L 25/03019 375/350 |
| 9,325,489 | B2* | 4/2016 | Hsieh .................... H04L 7/0334 |
| 9,467,314 | B1 | 10/2016 | Wei et al. |
| 10,326,622 | B2* | 6/2019 | Chen .................... G06F 3/0604 |
| 10,721,103 | B2* | 7/2020 | Lee .................. H04L 25/03057 |

FOREIGN PATENT DOCUMENTS

TW          201916013           4/2019

OTHER PUBLICATIONS

"Office Action of Taiwan Counterpart Application", dated Mar. 30, 2020, p. 1-p. 6.

* cited by examiner

*Primary Examiner* — Patrick O Neill
(74) *Attorney, Agent, or Firm* — JCIPRNET

(57) ABSTRACT

A signal receiving circuit, a memory storage device and a signal receiving method are provided. The signal receiving circuit includes an equalizer module, a clock and data recovery (CDR) circuit and a controller. The equalizer module is configured to receive a first signal and compensate the first signal to generate a second signal. The CDR circuit is configured to perform a phase locking on the second signal. The controller is configured to open or close a signal pattern filter of the CDR circuit according to the second signal, wherein the signal pattern filter is configured to filter a signal having a specific pattern in the second signal.

21 Claims, 5 Drawing Sheets

SIGNAL RECEIVING CIRCUIT, MEMORY STORAGE DEVICE AND SIGNAL RECEIVING METHOD

CROSS-REFERENCE TO RELATED APPLICATION

This application claims the priority benefit of Taiwan application serial no. 108146821, filed on Dec. 20, 2019. The entirety of the above-mentioned patent application is hereby incorporated by reference herein and made a part of this specification.

BACKGROUND

1. Technology Field

The disclosure relates to a signal receiving technique, and more particularly, to a signal receiving circuit, a memory storage device and a signal receiving method.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, in order to overcome a channel loss when a signal is transmitted, a receiver circuit of the signal uses an equalizer to compensate the received signal and uses a clock data recovery circuit to perform a phase locking on the signal. In addition, in certain receiver circuits, in order to prevent the adverse effect from a signal having a specific pattern on the phase locking, the clock and data recovery circuit may filter the signal having the specific pattern. However, in some cases, filtering the signal having the specific pattern according to different channel statuses will reduce a phase locking efficiency of the clock and data recovery circuit, thereby reducing the overall signal receiving capability of the receiver circuit.

SUMMARY

The disclosure provides a signal receiving circuit, a memory storage device and a signal receiving method that can improve or maintain a signal receiving capability for different channel statuses.

An exemplary embodiment of the disclosure provides a signal receiving circuit, which includes an equalizer module, a clock and data recovery circuit and a controller. The equalizer module is configured to receive a first signal and compensate the first signal to generate a second signal. The clock and data recovery circuit is coupled to the equalizer module and configured to perform a phase locking on the second signal. The controller is coupled to the equalizer module and the clock and data recovery circuit. The controller is configured to open or close a signal pattern filter of the clock and data recovery circuit according to the second signal, and the signal pattern filter is configured to filter a signal having a specific pattern in the second signal.

An exemplary embodiment of the disclosure further provides a memory storage device, which includes a connection interface unit, a rewritable non-volatile memory module, a signal receiving circuit and a memory control circuit unit. The connection interface unit is configured to couple to a host system. The signal receiving circuit is disposed at the connection interface unit. The memory control circuit unit is coupled to the connection interface unit, the rewritable non-volatile memory module and the signal receiving circuit. The signal receiving circuit is configured to receive a first signal and compensate the first signal to generate a second signal. The signal receiving circuit is further configured to perform a phase locking on the second signal. The signal receiving circuit is further configured to open or close a signal pattern filter according to the second signal, and the signal pattern filter is configured to filter a signal having a specific pattern in the second signal.

An exemplary embodiment of the disclosure further provides a signal receiving method for a memory storage device. The signal receiving method includes: receiving a first signal and compensating the first signal to generate a second signal; performing a phase locking on the second signal; and opening or closing a signal pattern filter according to the second signal, wherein the signal pattern filter is configured to filter a signal having a specific pattern in the second signal.

Based on the above, after the first signal is compensated to generate the second signal, the signal pattern filter used for filtering the signal having the specific pattern in the clock and data recovery circuit may be dynamically opened or closed according to the second signal. As a result, the signal receiving capability at the signal receiver end may be effectively improved or maintained for different channel statuses.

To make the aforementioned more comprehensible, several embodiments accompanied with drawings are described in detail as follows.

DESCRIPTION OF THE EMBODIMENTS

Exemplary embodiments are provided below to describe the disclosure in detail, though the disclosure is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
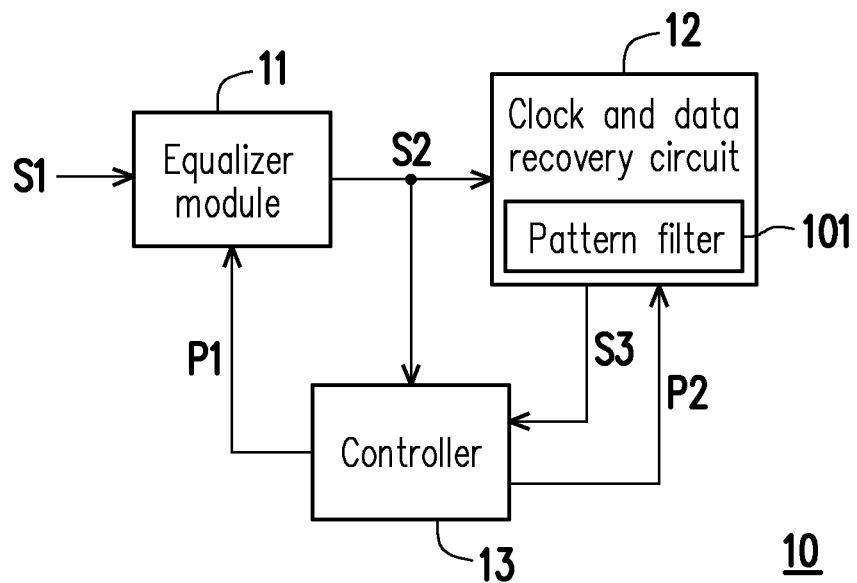
FIG. 1 is a schematic diagram of a signal receiving circuit illustrated according to an exemplary embodiment of the disclosure.

FIG. 1 is a schematic diagram of a signal receiving circuit illustrated according to an exemplary embodiment of the disclosure. Referring to FIG. 1, a signal receiving circuit 10 includes an equalizer module 11, a clock and data recovery circuit 12 and a controller 13. The equalizer module 11 is configured to receive a signal (a.k.a. a first signal) S1 and compensate the signal S1 to generate a signal (a.k.a. a second signal) S2. For example, the equalizer module 11 may include at least one of a linear equalizer, a continuous-time linear equalizer (CTLE), an infinite impulse response (IIR) circuit and a decision feedback equalizer (DFE). The equalizer module 11 may compensate (e.g., amplify) the signal Si according to a current channel status to generate the signal S2.

The clock and data recovery circuit 12 is coupled to the equalizer module 11. The clock and data recovery circuit 12 is configured to receive the signal S2 and perform a phase locking on the signal S2 to generate a signal S3 (a.k.a. a third signal). For example, the clock and data recovery circuit 12 may include a phase detection circuit (not illustrated), a charging circuit (not illustrated) and a voltage-controlled oscillator (not illustrated). Through the co-operation of the phase detection circuit, the charging circuit and the voltage-controlled oscillator, the clock and data recovery circuit 12 may gradually synchronize a phase of the signal S2 with a phase of the signal S3. When the phase of the signal S2 changes, the clock and data recovery circuit 12 may synchronize the phase of the signal S2 with the phase of the signal S3 again. In an exemplary embodiment, the operation of synchronizing the phase of the signal S2 with the phase of the signal S3 is also known as the phase locking.

It should be noted that, the clock and data recovery circuit 12 further includes a signal pattern filter (a.k.a. a pattern filter) 101. The signal pattern filter 101 may be dynamically opened or closed. After the signal pattern filter 101 is opened, the signal pattern filter 101 may be used to filter a signal having a specific pattern in the signal S2, and the clock and data recovery circuit 12 may process (e.g., perform the phase locking on) only the signal having the specific pattern in the signal S2. For example, it is assumed that the specific pattern corresponds to bit "001". After the signal pattern filter 101 is opened, the signal pattern filter 101 may be used to filter a signal having bit "001" in the signal S2, and the clock and data recovery circuit 12 processes only the signal having bit "001" in the signal S2. In addition, if the signal pattern filter 101 is not opened (i.e., closed), the signal pattern filter 101 may not filter the signal having the specific pattern in the signal S2, and the clock and data recovery circuit 12 may process the signal not having the specific pattern or all signals in the signal S2.

The controller 13 is coupled to the equalizer module 11 and the clock and data recovery circuit 12. The controller 13 is configured to open or close the signal pattern filter 101 according to the signal S2. The controller 13 may include, for example, a central processing unit or other programmable microprocessor for general purpose or special purpose, an embedded controller, a digital signal processor (DSP), a programmable controller, an application specific integrated circuit (ASIC), a programmable logic device (PLD) or other similar devices or a combination of above-mentioned devices. Moreover, the controller 13 is further configured to determine or adjust a setting parameter of the equalizer module 11 according to the signal S2.

In an exemplary embodiment, the controller 13 may send a signal (a.k.a. a first control signal) P1 to the equalizer module 11 according to the signals S2 and S3 so as to adjust the setting parameter of the equalizer module 11 through the signal P1. For example, a compensation capability of the equalizer module 11 for the signal S1 may be adjusted by adjusting the setting parameter of the equalizer module 11. The equalizer module 11 may continuously compensate the signal S1 and generate the signal S2 according to the setting parameter.

In an exemplary embodiment, the controller 13 may transmit a signal (a.k.a. a second control signal) P2 to the clock and data recovery circuit 12 according to the signal S2. The clock and data recovery circuit 12 may open or close the signal pattern filter 101 according to the signal P2. For example, the signal P2 may instruct a specific signal pattern filter in the signal pattern filter 101 to be opened or closed.

In an exemplary embodiment, the controller 13 may analyze the signal S2 to obtain at least one evaluation parameter. In an exemplary embodiment, this evaluation parameter may reflect a convergence state of the equalizer module 11. In an exemplary embodiment, this evaluation parameter may reflect a channel status related to the signal S1. In an exemplary embodiment, this evaluation parameter may reflect at least one of the convergence state of the equalizer module 11 and a channel loss status when the signal S1 is received.

In an exemplary embodiment, the controller 13 may adjust the setting parameter of the equalizer module 11 and/or open (or close) the signal pattern filter 101 according to this evaluation parameter. For example, in an exemplary embodiment, if the evaluation parameter reflects that the convergence state of the equalizer module 11 is not good and/or the channel status is poor (e.g., a channel loss of the signal S1 is large), the controller 13 may adjust the setting parameter of the equalizer module 11 and/or may open the signal pattern filter 101. Alternatively, in an exemplary embodiment, if the evaluation parameter reflects that the convergence state of the equalizer module 11 is good and/or the channel status is better (e.g., the channel loss of the signal S1 is small), the controller 13 may not adjust the setting parameter of the equalizer module 11 and/or may close the signal pattern filter 101.

In an exemplary embodiment, the controller 13 may determine whether to open or close the signal pattern filter 101 according to a comparison result between this evaluation parameter and at least one threshold. In an exemplary embodiment, it is assumed that a quantity of the signal pattern filters 101 is one. The controller 13 may open the signal pattern filter 101 if the comparison result matches a preset condition. However, the controller 13 may close the signal pattern filter 101 if the comparison result does not match the preset condition.

In an exemplary embodiment, it is assumed that the quantity of the signal pattern filters 101 is more than one, and the signal pattern filters 101 may be used to filter signals having different patterns in the signal S2. For example, it is assumed that the signal pattern filter 101 includes a first signal pattern filter and a second signal pattern filter. The first signal pattern filter is configured to filter a signal having a first pattern in the signal S2. The second signal pattern filter is configured to filter a signal having a second pattern in the signal S2. The first pattern is different from the second pattern. For example, the first pattern may correspond to bit "001" and/or the second pattern may correspond to bit "010". One or both of the first signal pattern filter and the second may be opened (or closed).

In an exemplary embodiment, the threshold at least includes a first threshold and a second threshold. The controller 13 may compare the obtained evaluation parameter with the first threshold and/or the second threshold. If the comparison result matches a preset condition (a.k.a. a first preset condition), the controller 13 may open the first signal pattern filter and not open the second signal pattern filter. Alternatively, if the comparison result matches another preset condition (a.k.a. a second preset condition), the controller 13 may open the second signal pattern filter and not open the first signal pattern filter. Alternatively, if the comparison result matches another preset condition (a.k.a. a third preset condition), the controller 13 may open the first signal pattern filter and the second signal pattern filter at the same time. Alternatively, if the comparison result matches another preset condition (a.k.a. a fourth preset condition), the controller 13 may close the first signal pattern filter and the second signal pattern filter at the same time.

In an exemplary embodiment, the controller 13 may adjust the setting parameter of the equalizer module 11 according to a current control (e.g., opening or closing) on the signal pattern filter 101. For example, if the controller 13 determines to open one specific signal pattern filter in the signal pattern filter 101, the controller 13 may synchronously adjust the setting parameter of the equalizer module 11. For example, the controller 13 may instruct the equalizer module 11 to adopt the setting parameter that matches the opened signal pattern filter in the signal pattern filter 101. For example, when the controller 13 instructs the first signal pattern filter to be opened, the controller 13 may synchronously instruct the equalizer module 11 to adopt the setting parameter that matches the first signal pattern filter. Alternatively, when the controller 13 instructs the second signal pattern filter to be opened, the controller 13 may synchronously instruct the equalizer module 11 to adopt the setting parameter that matches the second signal pattern filter. Alternatively, when the controller 13 instructs the first signal pattern filter and the second signal pattern filter to be opened at the same time, the controller 13 may synchronously instruct the equalizer module 11 to adopt the setting parameter that matches the first signal pattern filter and the second signal pattern filter opened at the same time.

Figure 2:
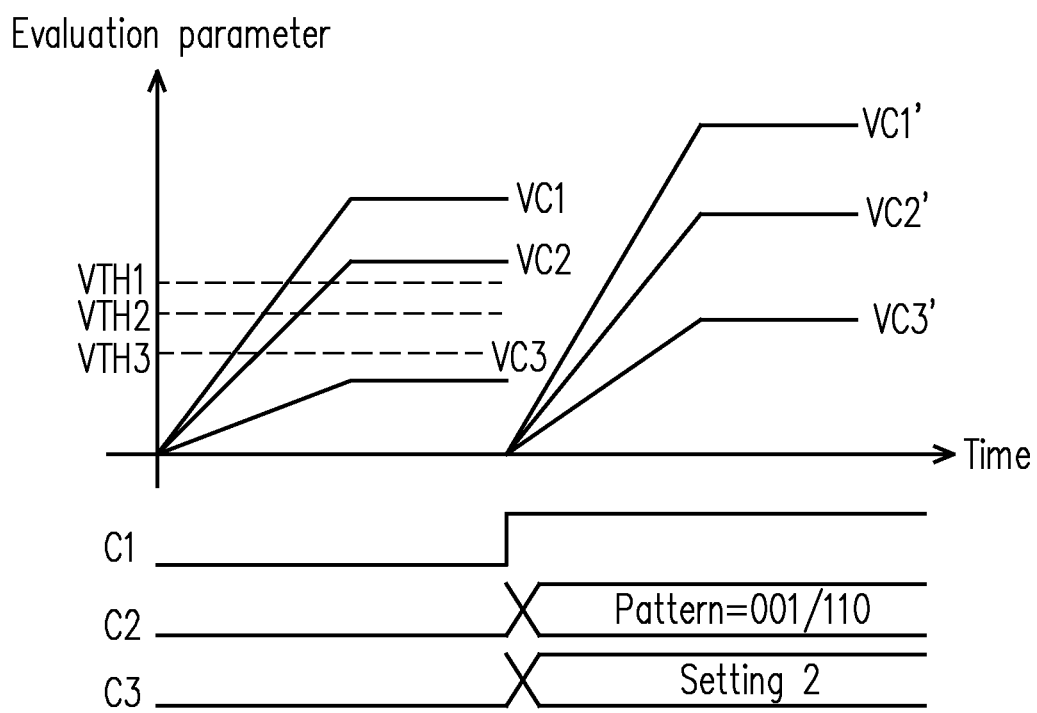
FIG. 2 is a schematic diagram for adjusting a setting parameter of an equalizer module and controlling a signal pattern filter according to an evaluation parameter illustrated according to an exemplary embodiment of the disclosure.

FIG. 2 is a schematic diagram for adjusting a setting parameter of an equalizer module and controlling a signal pattern filter according to an evaluation parameter illustrated according to an exemplary embodiment of the disclosure. It should be noted that the horizontal axis in the graph of FIG. 2 is time, and the vertical axis is the evaluation parameter.

Referring to FIG. 2, a signal C1 at logic low indicates that one specific signal pattern filter is in an off state, and the signal C1 at logic high indicates that this specific signal pattern filter is in an on state. A signal C2 is used to indicate a specific pattern (e.g., bits "001" and "110") that this specific signal pattern filter can be filter when this specific signal pattern filter in the on state. In addition, a signal C3 is used to indicate the setting parameter adopted by the equalizer module 11 of FIG. 1 when this signal pattern filter is in the on state.

In the exemplary embodiment of FIG. 2, it is assumed that the signal C1 is at logic low at first, and thus the signal pattern filter corresponding to the signal C1 is in the off state. Here, when this signal pattern filter is in the off state, three evaluation parameters are continuously obtained until they are converged to convergence values VC1 to VC3, respectively. After the evaluation parameters are respectively converged to the convergence values VC1 to VC3, the convergence values VC1 to VC3 may be compared with thresholds VTH1 to VTH3, respectively.

In this exemplary embodiment, it is assumed that the comparison result is that the convergence value VC1 is greater than the threshold VTH1, the convergence value VC2 is greater than the threshold VTH2, and the convergence value VC3 is less than the threshold VTH3. According to such comparison result, the controller 13 of FIG. 1 may instruct the signal pattern filter that can be used to filter the signal carrying bits "001" or "110" in the signal pattern filter 101 to be opened and instruct the equalizer module 11 to adopt the setting parameter corresponding to "Setting 2". For example, when the signal pattern filter corresponding to the signal C1 is being opened (i.e., the signal C1 is at logic high), only the signal carrying bits "001" or "110" may be processed by the clock and data recovery circuit 12 of FIG. 1 (e.g., performing the phase locking).

After the signal pattern filter corresponding to the signal C1 is opened (i.e., the signal C1 at logic high) and the equalizer module 11 and the clock and data recovery circuit 12 of FIG. 1 are reran, three evaluation parameters may be re-obtained and converged to new convergence values VC1' to VC3', respectively. The new convergence values VC1' to VC3' are higher than the thresholds VTH1 to VTH3, respectively.

It should be noted that, in the exemplary embodiment of FIG. 2, it is assumed that the current channel status is poor (e.g., the channel loss of the signal S1 in FIG. 1 is large). Therefore, before the signal pattern filter corresponding to the signal C1 is opened (i.e., the signal C1 is at logic low), the convergence values VC1 to VC3 reflect that the convergence state of the equalizer module 11 of FIG. 1 is poor. However, after the signal pattern filter corresponding to the signal C1 is opened (i.e., the signal C1 is at logic high), by filtering the signal having the specific pattern, the new convergence values VC1' to VC3' reflect that the convergence state (e.g., a convergence speed) of the equalizer module 11 is significantly improved. In addition, the new setting parameter "Setting 2" adopted by the equalizer module 11 may also help in improving the convergence state of the equalizer module 11.

It should be noted that, in the exemplary embodiment of FIG. 2, at least one of the convergence values VC1 to VC3 being larger indicates that the convergence state of the equalizer module 11 of FIG. 1 is better (and/or the channel status is better). However, the disclosure is not limited in this regard. In another exemplary embodiment, it is also possible that at least one of the convergence values VC1 to VC3 being smaller indicates the convergence state of the equalizer module 11 of FIG. 1 is better (and/or the channel status is better), depending on actual requirements.

Furthermore, in another exemplary embodiment of FIG. 2, if the comparison result reflects a change in a numerical relationship between at least one of the convergence values VC1 to VC3 and the corresponding thresholds VTH1 to VTH3, one or more signal pattern filters in the signal pattern filter 101 of FIG. 1 may be correspondingly opened or closed, and/or a different setting parameter may be applied to the equalizer module 11 of FIG. 1.

Figure 3:
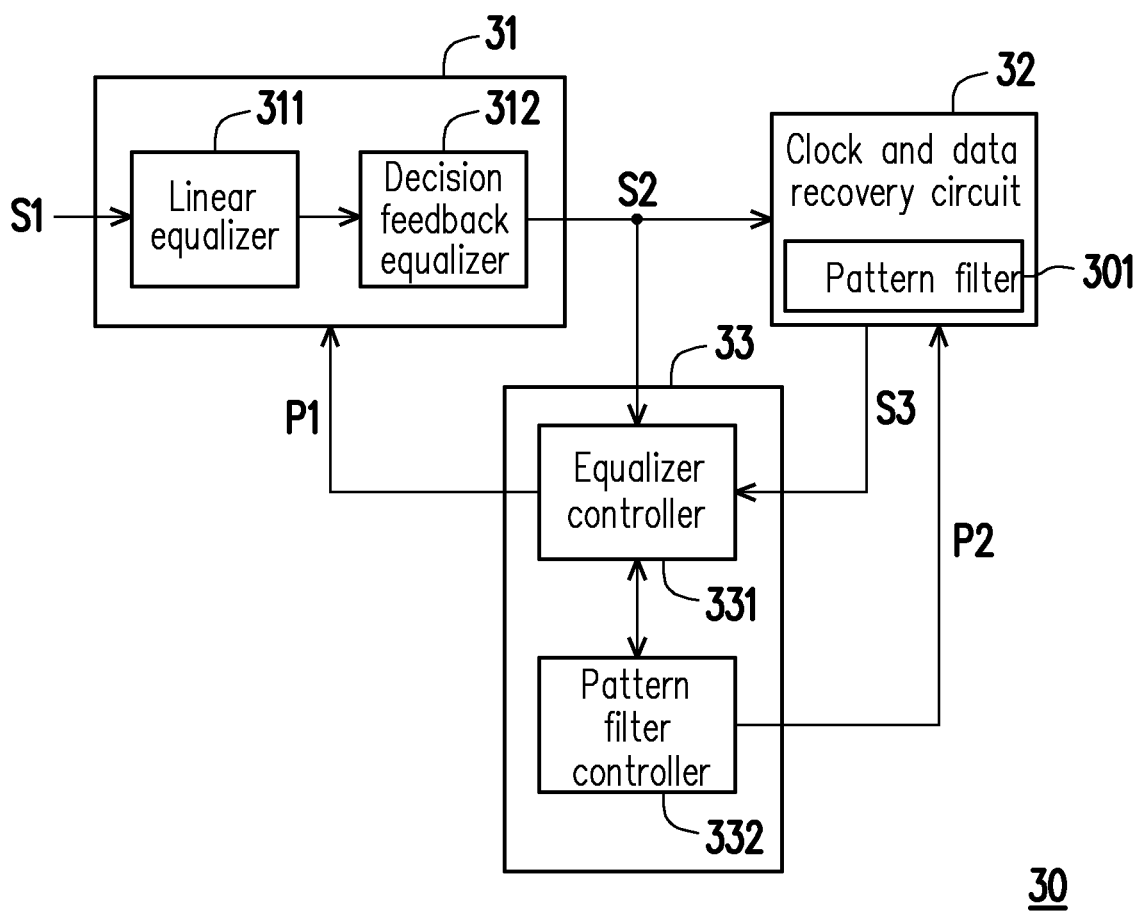
FIG. 3 is a schematic diagram of a signal receiving circuit illustrated according to an exemplary embodiment of the disclosure.

FIG. 3 is a schematic diagram of a signal receiving circuit illustrated according to an exemplary embodiment of the disclosure. Referring to FIG. 3, in this exemplary embodiment, a signal receiving circuit 30 includes an equalizer module 31, a clock and data recovery circuit 32 and a controller 33.

The equalizer module 31 includes a linear equalizer 311 and a decision feedback equalizer (DFE) 312. The signal S1 may be sequentially processed (e.g., compensated) by the linear equalizer 311 and the decision feedback equalizer 312 to generate the signal S2. It should be noted that, in another exemplary embodiment, the decision feedback equalizer 312 may also be replaced by the continuous-time linear equalizer (CTLE) or other type of equalizer.

The clock and data recovery circuit 32 may perform the phase locking on the signal S2 to generate the signal S3. In addition, the clock and data recovery circuit 32 includes a signal pattern filter 301. The signal pattern filter 301 may be dynamically opened or closed to determine whether to filter a signal having a specific pattern in the signal S2. After the signal pattern filter 301 is opened, the clock and data recovery circuit 32 may process (e.g., perform the phase locking on) the signal passed through the signal pattern filter 301.

The controller 33 includes an equalizer controller 331 and a signal pattern filter controller 332. The equalizer controller 331 is configured to receive and analyze the signals S2 and S3. The equalizer controller 331 may generate the signal P1 according to an analysis result, so as to control or adjust a setting parameter of the equalizer controller 311 and/or the signal pattern filter controller 332 through the signal P1. The signal pattern filter controller 332 may generate the signal P2 according to the analysis result of the equalizer controller 331 and control opening or closing of the signal pattern filter 301 through the signal P2. In addition, the signal pattern filter controller 332 may also instruct the equalizer controller 331 to synchronously adjust the setting parameter of the equalizer controller 331 and/or the signal pattern filter controller 322 according to whether the signal pattern filter 301 is opened or closed.

In an exemplary embodiment, the equalizer controller 311 may analyze the signal S2 to obtain the evaluation parameter. The signal pattern filter controller 332 may control opening or closing of the signal pattern filter 301 according to the evaluation parameter. Moreover, the signal pattern filter controller 332 may also instruct the equalizer controller 311 to synchronously adjust the setting parameter of the equalizer controller 331 and/or the signal pattern filter controller 322 according to the evaluation parameter. For example, a specific signal pattern filter that matches the signal pattern filter 301 may be applied to the equalizer controller 331 and/or the signal pattern filter controller 332.

It should be noted that operation details regarding how to control opening or closing of the signal pattern filter 301 according the evaluation parameter and synchronously adjust the setting parameter of the equalizer controller 331 and/or the signal pattern filter controller 332 have been described above, and are thus not repeated hereinafter.

It should be noted that, in the foregoing exemplary embodiments, it is assumed that the signal filtered by the signal pattern filter will then be input to the clock and data recovery circuit (i.e., the signal filtered by the signal pattern filter will pass through the signal pattern filter) for processing. However, in another exemplary embodiments, it is also possible that the signal filtered by the signal pattern filter will not input to the clock and data recovery circuit (i.e., the signal filtered by the signal pattern filter cannot pass through the signal pattern filter) as long as an operation performance of the equalizer module and/or the clock and data recovery circuit may be optimized.

In an exemplary embodiment, the signal receiving circuit 10 of FIG. 1 and/or the signal receiving circuit 30 of FIG. 3 may be disposed in a memory storage device. In another exemplary embodiment, the signal receiving circuit 10 of FIG. 1 and/or the signal receiving circuit 30 of FIG. 3 may also be disposed in other type of electronic device, and is not limited to the memory storage device.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 4:
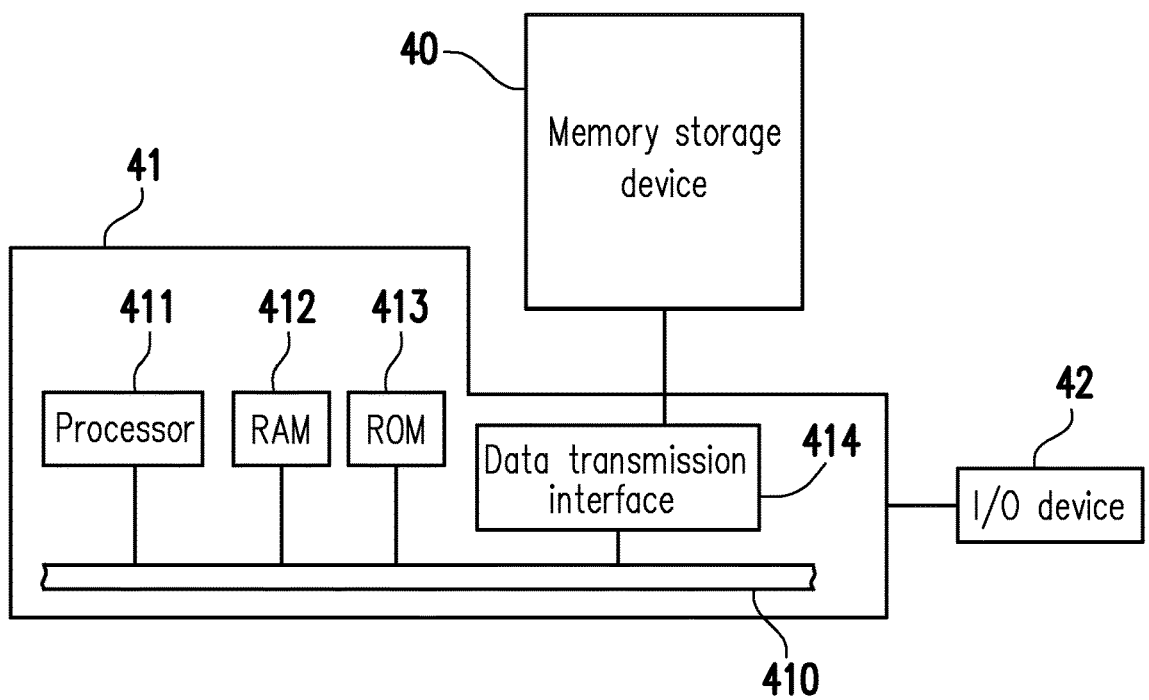
FIG. 4 is a schematic diagram illustrating a host system, a memory storage device and an I/O (input/output) device according to an exemplary embodiment of the disclosure.
Figure 5:
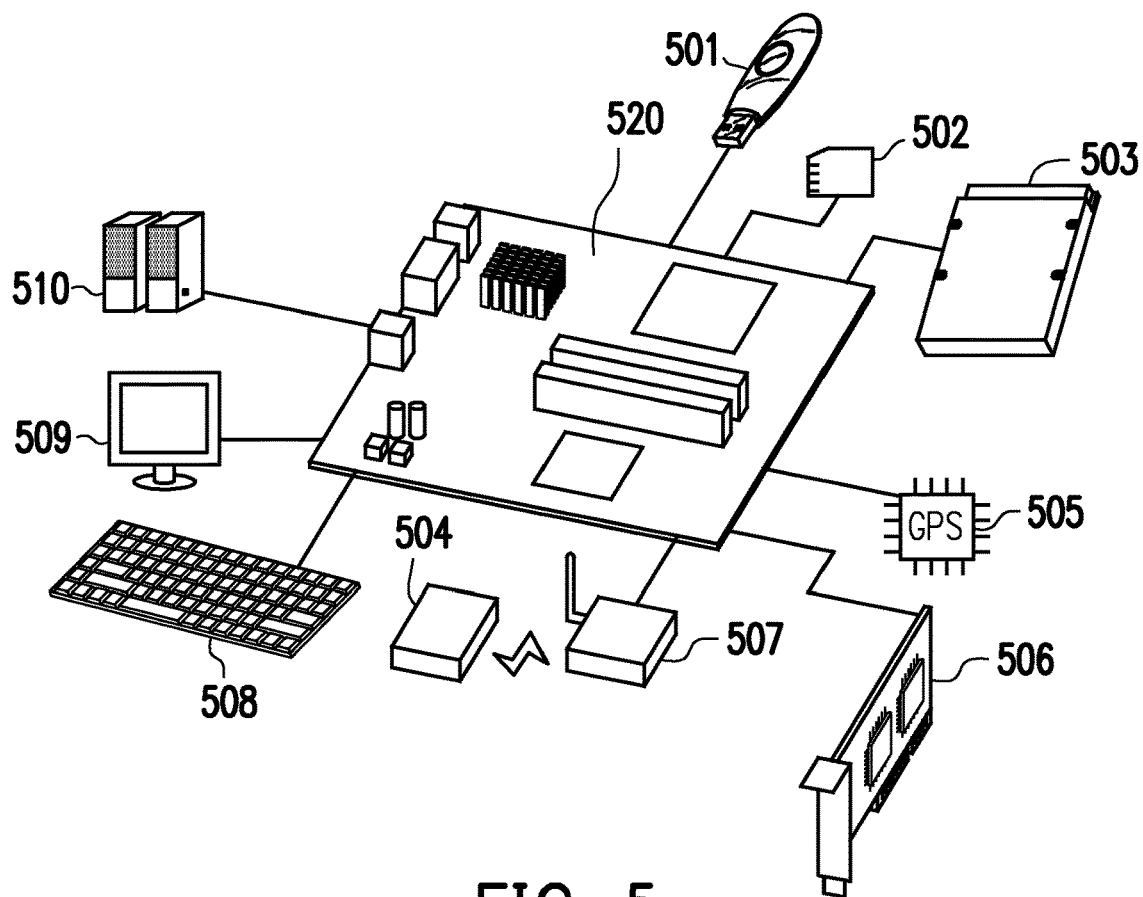
FIG. 5 is a schematic diagram illustrating a host system, a memory storage device and an I/O device according to another exemplary embodiment of the disclosure.

FIG. 4 is a schematic diagram illustrating a host system, a memory storage device and an I/O (input/output) device according to an exemplary embodiment of the disclosure. FIG. 5 is a schematic diagram illustrating a host system, a memory storage device and an I/O device according to another exemplary embodiment of the disclosure.

Referring to FIG. 4 and FIG. 5, a host system 41 generally includes a processor 411, a RAM (random access memory) 412, a ROM (read only memory) 413 and a data transmission interface 414. The processor 411, the RAM 412, the ROM 413 and the data transmission interface 414 are coupled to a system bus 410.

In this exemplary embodiment, the host system 41 is coupled to a memory storage device 40 through the data transmission interface 414. For example, the host system 41 can store data into the memory storage device 40 or read data from the memory storage device 40 via the data transmission interface 414. Further, the host system 41 is coupled to an I/O device 42 via the system bus 410. For example, the host system 41 can transmit output signals to the VO device 42 or receive input signals from the I/O device 42 via the system bus 410.

In the present exemplary embodiment, the processor 411, the RAM 412, the ROM 413 and the data transmission interface 414 may be disposed on a main board 520 of the host system 41. The number of the data transmission interface 414 may be one or more. Through the data transmission interface 414, the main board 520 may be coupled to the memory storage device 10 in a wired manner or a wireless manner. The memory storage apparatus 40 may be, for example, a flash drive 501, a memory card 502, a SSD (Solid State Drive) 503 or a wireless memory storage apparatus 504. The wireless memory storage device 504 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 520 may also be coupled to various I/O devices including a GPS (Global Positioning System) module 505, a network interface card 506, a wireless transmission device 507, a keyboard 508, a monitor 509 and a speaker 510 through the system bus 410. For example, in an exemplary embodiment, the main board 520 can access the wireless memory storage device 504 via the wireless transmission device 507.

Figure 6:
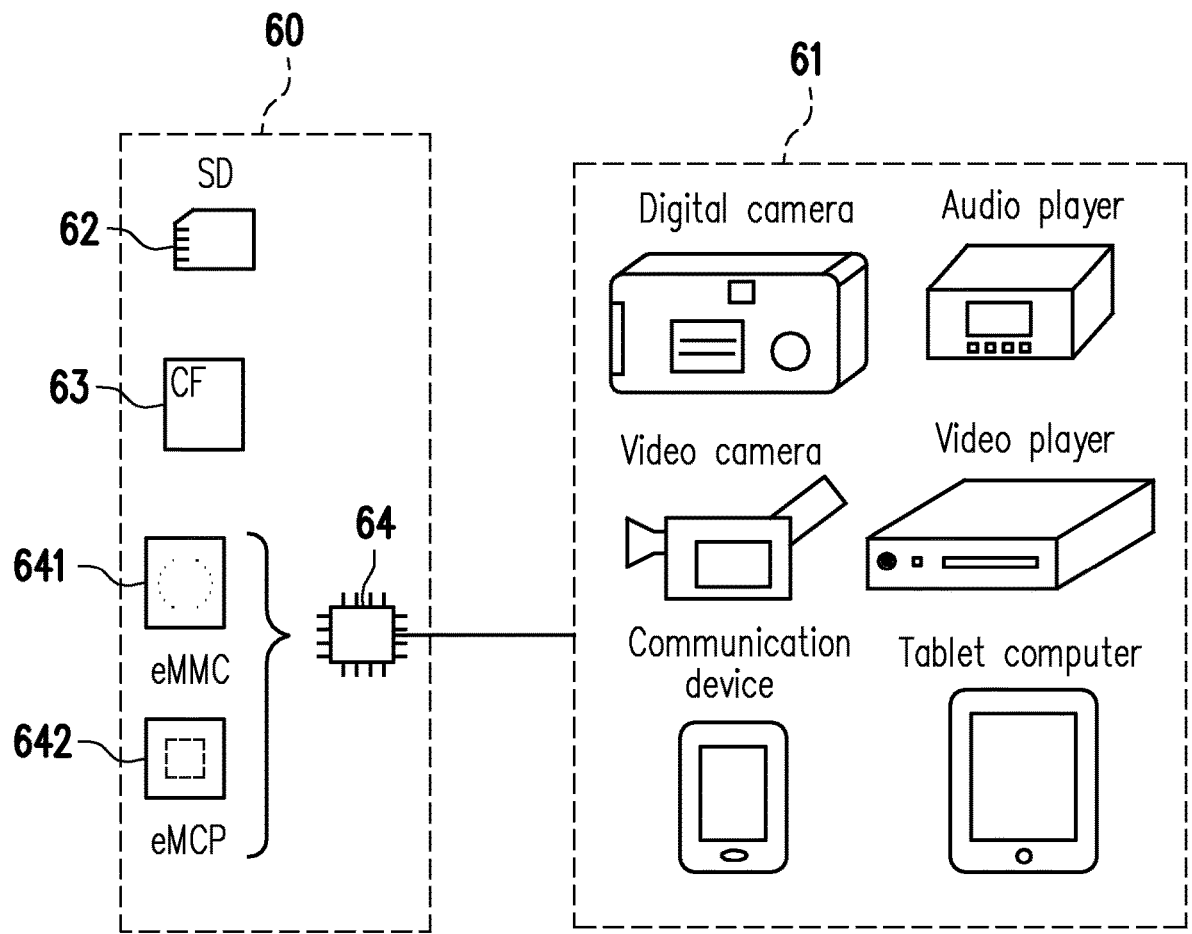
FIG. 6 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 6 is a schematic diagram illustrating a host system and a memory storage device according to another exemplary embodiment of the disclosure. Referring to FIG. 6, in another exemplary embodiment, a host system 61 may also be a system such as a digital camera, a video camera, a communication device, an audio player, a video player or a tablet computer, whereas a memory storage device 60 may be various non-volatile memory storage devices used by the host system, such as a SD (Secure Digital) card 62, a CF (Compact Flash) card 63 or an embedded storage device 64. The embedded storage device 64 includes various embedded storage devices capable of directly coupling a memory module onto a substrate of the host system, such as an eMMC (embedded Multi Media Card) 641 and/or an eMCP (embedded Multi Chip Package) storage device 642.

Figure 7:
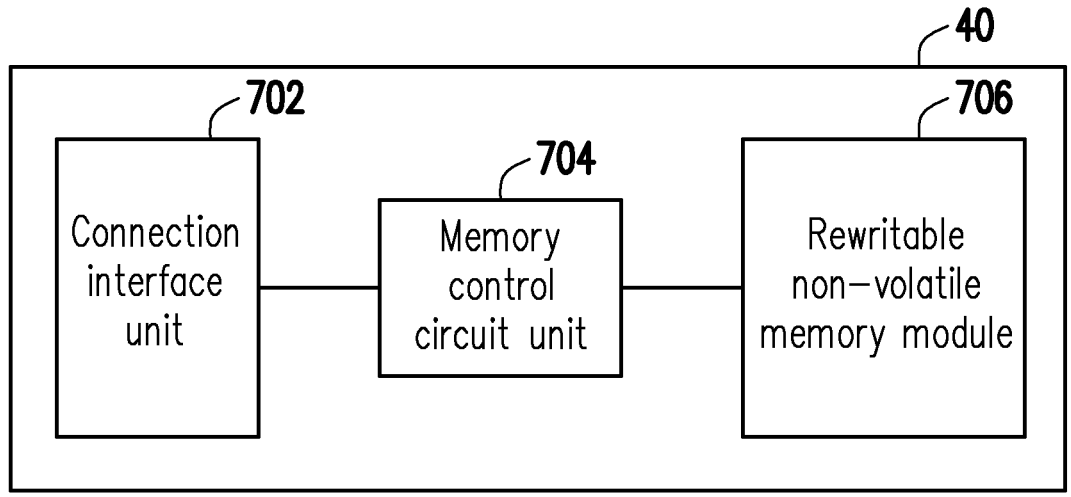
FIG. 7 is a schematic block diagram illustrating a memory storage device according to an exemplary embodiment of the disclosure.

FIG. 7 is a schematic block diagram illustrating a memory storage device according to an exemplary embodiment of the disclosure. Referring to FIG. 7, the memory storage device 40 includes a connection interface unit 702, a memory controlling circuit unit 704 and a rewritable non-volatile memory module 706.

The connection interface unit 702 is configured to couple to the memory storage device 40 to the host system 41. The memory storage device 40 can communicate with the host system 41 through the connection interface unit 702. In this exemplary embodiment, the connection interface unit 702 is compatible with a SATA (Serial Advanced Technology Attachment) standard. Nevertheless, it should be understood that the disclosure is not limited in this regard. The connection interface unit 702 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 702 and the memory controlling circuit unit 704 may be packaged into one chip, or the connection interface unit 702 is distributed outside of a chip containing the memory controlling circuit unit 704.

The memory control circuit unit 704 is configured to execute a plurality of logic gates or control commands which are implemented in a hardware form or in a firmware form and perform operations of writing, reading or erasing data in the rewritable non-volatile memory storage module 706 according to the commands of the host system 41.

The rewritable non-volatile memory module 706 is coupled to the memory control circuit unit 704 and configured to store data written from the host system 41. The rewritable non-volatile memory module 706 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a Quad Level Cell (MLC) NAND-type flash memory module (i.e., a flash memory module capable of storing four bits in one memory cell), other flash memory modules or other memory modules having the same features.

In the rewritable non-volatile memory module 706, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". With changes in the threshold voltage, each of the memory cells in the rewritable non-volatile memory module 1006 has a plurality of storage states. The storage state to which the memory cell belongs may be determined by applying a read voltage to the memory cell, so as to obtain the one or more bits stored in the memory cell.

In this exemplary embodiment, the memory cells of the rewritable non-volatile memory module 706 may constitute a plurality of physical programming units, and the physical programming units can constitute a plurality of physical erasing units. Specifically, the memory cells on the same word line may constitute one or more of the physical programming units. If each of the memory cells can store two or more bits, the physical programming units on the same word line may be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units may include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In an exemplary embodiment, the rewritable non-volatile memory module 706 of FIG. 7 is also known as a flash memory module. In an exemplary embodiment, the memory control circuit unit 704 of FIG. 7 is also known as a flash memory controller for controlling the flash memory module.

In an exemplary embodiment, the signal receiving circuit 10 of FIG. 1 and/or the signal receiving circuit 30 of FIG. 3 may be disposed in the connection interface unit 702 of FIG. 7 to receive the signal S1 from the host system 41. For example, the signal S1 may include a data signal from the host system 41. In an exemplary embodiment, the signal receiving circuit 10 of FIG. 1 and/or the signal receiving circuit 30 of FIG. 3 may be disposed in the memory control circuit unit 704 and/or the rewritable non-volatile memory module 706 of FIG. 7.

Figure 8:
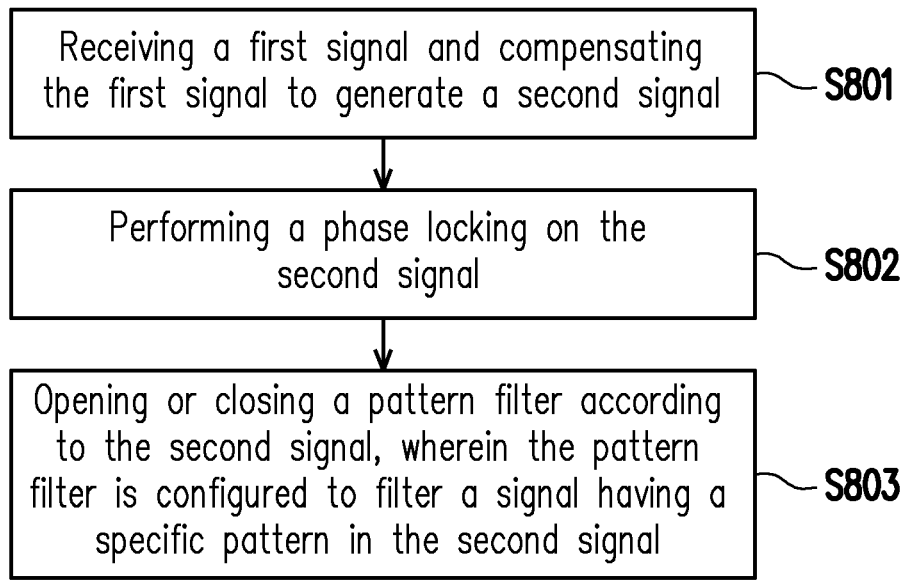
FIG. 8 is a flowchart illustrating a signal receiving method according to an exemplary embodiment of the disclosure.

FIG. 8 is a flowchart illustrating a signal receiving method according to an exemplary embodiment of the disclosure. Referring to FIG. 8, in step S801, a first signal is received and the first signal is compensated to generate a second signal. In step S802, a phase locking is performed on the second signal. In step S803, a signal pattern filter is opened or closed according to the second signal, wherein the signal pattern filter is configured to filter a signal having a specific pattern in the second signal.

Nevertheless, steps depicted in FIG. 8 are described in detail as above so that related description thereof is omitted hereinafter. It should be noted that, the steps depicted in FIG. 8 may be implemented as a plurality of program codes or circuits, which are not particularly limited in the disclosure. Moreover, the method of FIG. 8 may be implemented with reference to the foregoing exemplary embodiments, or may be implemented separately, which are not particularly limited in the disclosure.

In summary, after the first signal is compensated to generate the second signal, the signal pattern filter used for filtering the signal having the specific pattern in the clock and data recovery circuit may be dynamically opened or closed according to the second signal. For example, when the channel status is poor, one or more signal pattern filters may be opened to make the clock and data recovery circuit process only the signal having the specific pattern so as to attempt improving the operation performance of the equalizer module and/or the clock and data recovery circuit. Once the channel status becomes better, the previously opened signal pattern filter may be closed. As a result, the signal receiving capability at the signal receiver end may be effectively improved or maintained for different channel statuses.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A signal receiving circuit, comprising:
an equalizer module, configured to receive a first signal and compensate the first signal to generate a second signal;
a clock and data recovery circuit, coupled to the equalizer module and configured to perform a phase locking on the second signal; and
a controller, coupled to the equalizer module and the clock and data recovery circuit,
wherein the controller is configured to open or close a signal pattern filter of the clock and data recovery circuit according to the second signal, and the signal pattern filter is configured to filter a signal having a specific pattern in the second signal.

2. The signal receiving circuit according to claim 1, wherein after the signal pattern filter is opened, the clock and data recovery circuit processes only the signal having the specific pattern in the second signal.

3. The signal receiving circuit according to claim 1, wherein the operation of opening or closing the signal pattern filter of the clock and data recovery circuit according to the second signal comprises:
analyzing the second signal to obtain an evaluation parameter, wherein the evaluation parameter reflects at least one of a convergence state of the equalizer module and a channel loss status when the first signal is transmitted.

4. The signal receiving circuit according to claim 3, wherein the operation of opening or closing the signal pattern filter of the clock and data recovery circuit according to the second signal further comprises:
determining whether to open or close the signal pattern filter according to a comparison result between the evaluation parameter and a threshold.

5. The signal receiving circuit according to claim 4, wherein the operation of determining whether to open or close the signal pattern filter according to the comparison result between the evaluation parameter and the threshold comprises:
opening the signal pattern filter if the comparison result matches a preset condition; and
closing the signal pattern filter if the comparison result does not match the preset condition.

6. The signal receiving circuit according to claim 5, wherein the operation of opening the signal pattern filter if the comparison result matches the preset condition comprises:
opening a first signal pattern filter if the comparison result matches a first preset condition, wherein the first signal pattern filter is configured to filter a signal having a first pattern in the second signal; and
opening a second signal pattern filter if the comparison result matches a second preset condition, wherein the second signal pattern filter is configured to filter a signal having a second pattern in the second signal, and the first pattern is different from the second pattern.

7. The signal receiving circuit according to claim 1, wherein the controller is further configured to adjust a setting parameter of the equalizer module according to a control on the signal pattern filter.

8. A memory storage device, comprising:
a connection interface unit, configured to couple to a host system;
a rewritable non-volatile memory module;
a signal receiving circuit, disposed at the connection interface unit; and
a memory control circuit unit, coupled to the connection interface unit, the rewritable non-volatile memory module and the signal receiving circuit,
wherein the signal receiving circuit is configured to receive a first signal and compensate the first signal to generate a second signal,
the signal receiving circuit is further configured to perform a phase locking on the second signal,
the signal receiving circuit is further configured to open or close a signal pattern filter according to the second signal, and the signal pattern filter is configured to filter a signal having a specific pattern in the second signal.

9. The memory storage device according to claim 8, wherein after the signal pattern filter is opened, a clock and data recovery circuit in the signal receiving circuit processes only the signal having the specific pattern in the second signal.

10. The memory storage device according to claim 8, wherein the operation of opening or closing the signal pattern filter according to the second signal comprises:
analyzing the second signal to obtain an evaluation parameter, wherein the evaluation parameter reflects at least one of a convergence state of an equalizer module in the signal receiving circuit and a channel loss status when the first signal is transmitted.

11. The memory storage device according to claim 10, wherein the operation of opening or closing the signal pattern filter according to the second signal further comprises:
determining whether to open or close the signal pattern filter according to a comparison result between the evaluation parameter and a threshold.

12. The memory storage device according to claim 11, wherein the operation of determining whether to open or close the signal pattern filter according to the comparison result between the evaluation parameter and the threshold comprises:
opening the signal pattern filter if the comparison result matches a preset condition; and
closing the signal pattern filter if the comparison result does not match the preset condition.

13. The memory storage device according to claim 12, wherein the operation of opening the signal pattern filter if the comparison result matches the preset condition comprises:
opening a first signal pattern filter if the comparison result matches a first preset condition, wherein the first signal pattern filter is configured to filter a signal having a first pattern in the second signal; and
opening a second signal pattern filter if the comparison result matches a second preset condition, wherein the second signal pattern filter is configured to filter a signal having a second pattern in the second signal, and the first pattern is different from the second pattern.

14. The memory storage device according to claim 8, wherein the signal receiving circuit is further configured to adjust a setting parameter of an equalizer module according to a control on the signal pattern filter.

15. A signal receiving method for a memory storage device, the signal receiving method comprising:
receiving a first signal and compensating the first signal to generate a second signal;
performing a phase locking on the second signal; and
opening or closing a signal pattern filter according to the second signal, wherein the signal pattern filter is configured to filter a signal having a specific pattern in the second signal.

16. The signal receiving method according to claim 15, wherein after the signal pattern filter is opened, a clock and data recovery circuit in the memory storage device processes only the signal having the specific pattern in the second signal.

17. The signal receiving method according to claim 15, wherein the step of opening or closing the signal pattern filter according to the second signal comprises:
analyzing the second signal to obtain an evaluation parameter, wherein the evaluation parameter reflects at least one of a convergence state of an equalizer module in the memory storage device and a channel loss status when the first signal is transmitted.

18. The signal receiving method according to claim 17, wherein the step of opening or closing the signal pattern filter according to the second signal further comprises:
determining whether to open or close the signal pattern filter according to a comparison result between the evaluation parameter and a threshold.

19. The signal receiving method according to claim 18, wherein the operation of determining whether to open or close the signal pattern filter according to the comparison result between the evaluation parameter and the threshold comprises:
opening the signal pattern filter if the comparison result matches a preset condition; and
closing the signal pattern filter if the comparison result does not match the preset condition.

20. The signal receiving method according to claim 19, wherein the operation of opening the signal pattern filter if the comparison result matches the preset condition comprises:
opening a first signal pattern filter if the comparison result matches a first preset condition, wherein the first signal pattern filter is configured to filter a signal having a first pattern in the second signal; and
opening a second signal pattern filter if the comparison result matches a second preset condition, wherein the second signal pattern filter is configured to filter a signal having a second pattern in the second signal, and the first pattern is different from the second pattern.

21. The signal receiving method according to claim 15, further comprising:
adjusting a setting parameter of an equalizer module in the memory storage device according to a control on the signal pattern filter.

* * * * *